United States Patent
Lim

(10) Patent No.: US 8,043,932 B2
(45) Date of Patent: Oct. 25, 2011

(54) METHOD OF FABRICATING SEMICONDUCTOR DEVICE

(75) Inventor: Hyun-Ju Lim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 769 days.

(21) Appl. No.: 11/847,679

(22) Filed: Aug. 30, 2007

(65) Prior Publication Data

US 2008/0057721 A1   Mar. 6, 2008

(30) Foreign Application Priority Data

Sep. 6, 2006   (KR) .................. 10-2006-0085481

(51) Int. Cl.
*H01L 21/76* (2006.01)
(52) U.S. Cl. ........ 438/424; 438/444; 438/700; 438/702; 438/701; 148/DIG. 50; 257/E21.546; 257/E21.549
(58) Field of Classification Search ............... None
See application file for complete search history.

(56) References Cited

U.S. PATENT DOCUMENTS

| 6,066,544 A | * | 5/2000 | Pan et al. | 438/424 |
| 2006/0240673 A1 | * | 10/2006 | Lee | 438/700 |
| 2008/0057721 A1 | * | 3/2008 | Lim | 438/699 |
| 2008/0315352 A1 | * | 12/2008 | Lim | 257/510 |

FOREIGN PATENT DOCUMENTS

| KR | 1019980030769 A | 7/1998 |
| KR | 1020030050197 A | 6/2003 |

* cited by examiner

*Primary Examiner* — David Graybill
(74) *Attorney, Agent, or Firm* — Sherr & Vaughn, PLLC

(57) ABSTRACT

A method of fabricating a semiconductor device including at least one of the following steps: forming an oxide layer on and/or over a silicon substrate. Forming a first photoresist pattern on and/or over the oxide layer. Forming a trench by etching the oxide layer and the substrate using the first photoresist pattern as a mask. Removing the first photoresist pattern. Filling the trench with a trench oxide layer. Planarizing the trench oxide layer. Forming an etch stop layer on and/or over the trench oxide layer. Forming a second photoresist pattern on and/or over the etch stop layer. Etching the etch stop layer and the trench oxide layer using the second photoresist pattern as an etch mask. Removing the second photoresist pattern and the etch stop layer.

13 Claims, 4 Drawing Sheets

A 203
202
201

METHOD OF FABRICATING SEMICONDUCTOR DEVICE

The present application claims priority under 35 U.S.C. 119 to Korean Patent Application No. 10-2006-0085481 (filed on Sep. 6, 2006), which is hereby incorporated by reference in its entirety.

BACKGROUND

Aspects of semiconductor technology have focused on increasing the integration of semiconductor devices (e.g., achieving smaller scale devices). The trend toward such small scale devices may require reinforcing inter-element isolation in order to reduce the distances between semiconductor devices.

One method of isolating semiconductor devices electrically is forming a local oxidation (LOCOS) layer. A shortcoming of the LOCOS layer is that a bird's beak may occur at an edge of the field oxide layer because oxygen penetrates into a lateral side of the pad oxide layer from a bottom of the nitride layer used as a mask in the selective oxidation of the silicon substrate. The length of the bird's beak may extend the field oxide layer into an active area. Consequently, the electric characteristics of the transistor may be diminished.

Therefore, there is an increase in demand for a field oxide layer capable of occupying a small area but maintaining good isolation capability. Trench type field oxide layer, particular shallow trench isolation (STI), has been employed. STI may require selectively etching a portion of semiconductor substrate to form a trench for device isolation and filling the trench with an insulating layer.

Meanwhile, in order to obtain small scale devices the width of a trench provided within a substrate is decreased while increasing its depth. Because the decreased width and increased depth of the trench raise an aspect ratio of the trench, step coverage is degraded when depositing a trench insulating layer. An entrance of the trench is blocked before a deep portion of the trench is filled with the insulating layer. This shortcoming results in the reduction of filling the trench with the trench oxide layer.

Figure 1:
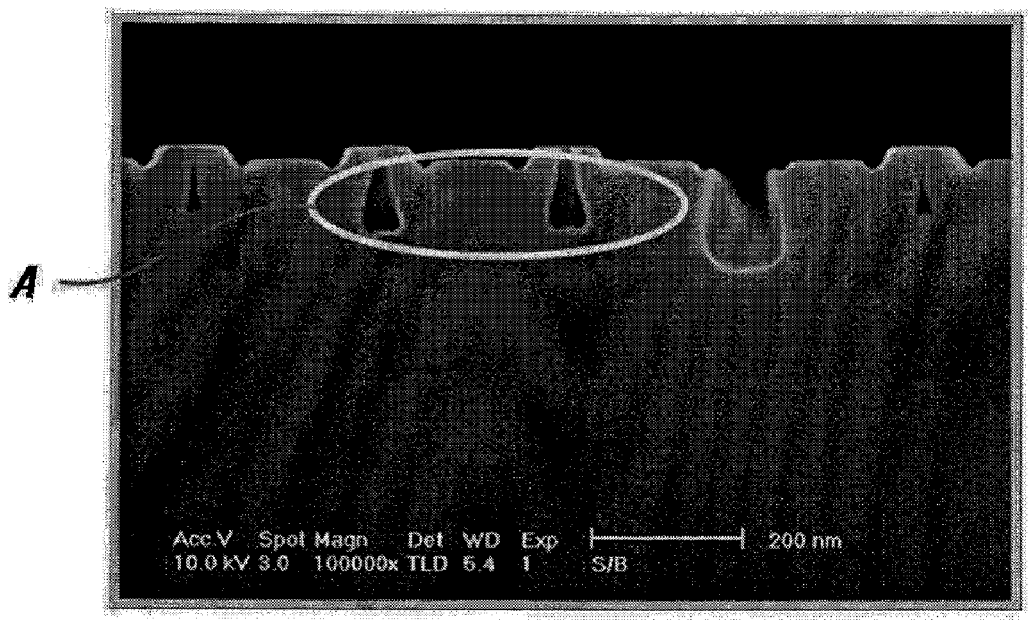

As illustrated in example FIG. 1, voids (A) can be generated due to the degraded gap-fill capability in filling the trenches with an insulator. If void (A) is generated within a trench oxide layer, it is exposed in the course of planarization of the trench oxide layer to interrupt the planarization. Moreover, if polysilicon deposited for forming an electrode later intrudes void (A), leakage current may be generated which diminishes the characteristics of the semiconductor device.

SUMMARY

Embodiments relate a method of fabricating a semiconductor device including at least one of the following steps: forming an oxide layer on and/or over a silicon substrate. Forming a first photoresist pattern on and/or over the oxide layer. Forming a trench by etching the oxide layer and the substrate using the first photoresist pattern as a mask. Removing the first photoresist pattern. Filling the trench with a trench oxide layer. Planarizing the trench oxide layer. Forming an etch stop layer on and/or over the trench oxide layer. Forming a second photoresist pattern on and/or over the etch stop layer. Etching the etch stop layer and the trench oxide layer using the second photoresist pattern as an etch mask. Removing the second photoresist pattern and the etch stop layer.

DRAWINGS

Example FIG. 1 illustrates voids generated using a STI method.

Example FIGS. 2A to 2H illustrate a method of forming STI in a semiconductor device, in accordance with embodiments.

DESCRIPTION

Figure 2A:
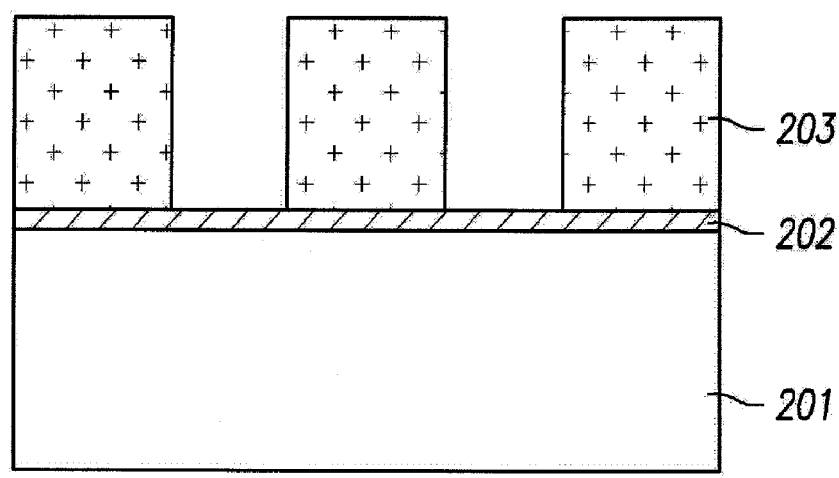

As illustrated in example FIG. 2A, oxide layer 202 may be formed on and/or over a surface of silicon substrate 201. Oxide layer 202 may be composed of tetraethyl orthosilicate (TEOS). A first photoresist layer may be formed on and/or over oxide layer 202. The first photoresist layer may be patterned to expose a device isolation layer forming area of substrate 201. Particularly, the first photoresist layer may be etched to form a plurality of first photoresist patterns 203 spaced apart from each other with a predetermined gap.

Figure 2B:
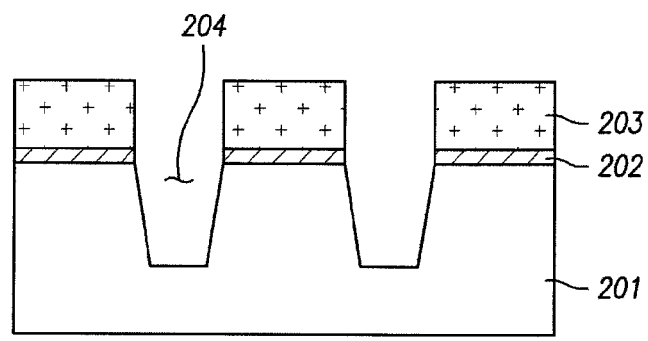

As illustrated in example FIG. 2B, oxide layer 202 may be etched using first photoresist patterns 203 as an etch mask to form trench 204 within substrate 201. Trench 204 may be formed using shallow trench isolation or by reactive ion etching (RIE). A plurality of trenches 204 may be formed by etching substrate 201. Substrate 201 may be etched using a dry etch method such as reactive ion etching (RIE) using first photoresist patterns 203 and etched oxide layer 202 as an etch mask. Alternatively, according to embodiments, after formation of trench 204, thermal diffusion may be conducted on an inner wall of trench 204 to prevent impurities from intruding silicon in the course of filling trench 204 with trench oxide layer 205.

Figure 2C:
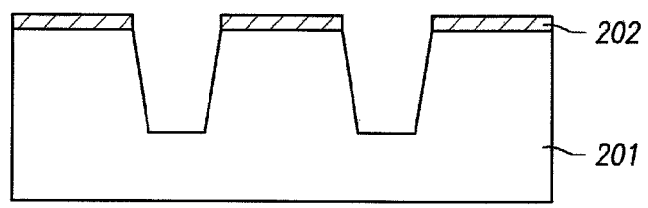
Figure 2D:
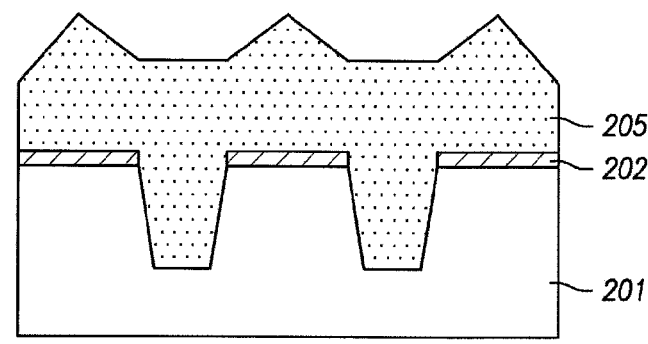

As illustrated in example FIG. 2C, first photoresist pattern 203 may be removed by ashing and cleaning. As illustrated in example FIG. 2D, trench oxide layer 205 may be deposited to a predetermined thickness on the overall surface of semiconductor substrate 201 to fill trench 204. An oxide having good gap-fill property may compose trench oxide layer 205. Trench oxide layer 205 can be formed using high density plasma chemical vapor deposition (HDP CVD). In filling up trench 204 with trench oxide layer 205, since an additional layer unnecessary for filling up the trench such as a hard mask including a pad oxide layer and a pad nitride layer does not exist on the substrate 201, an aspect ratio depth of the trench 204 corresponds to an actual depth of the trench 204. So, a gap-fill margin can be enhanced. In accordance with embodiments, filling trench 204 with trench oxide layer 205 does not require the addition of a layer such as such as a hard mask including a pad oxide layer and a pad nitride layer. Accordingly, an aspect ratio depth of trench 204 corresponds to an actual depth of trench 204, thereby enhancing a gap-fill margin.

Figure 2E:
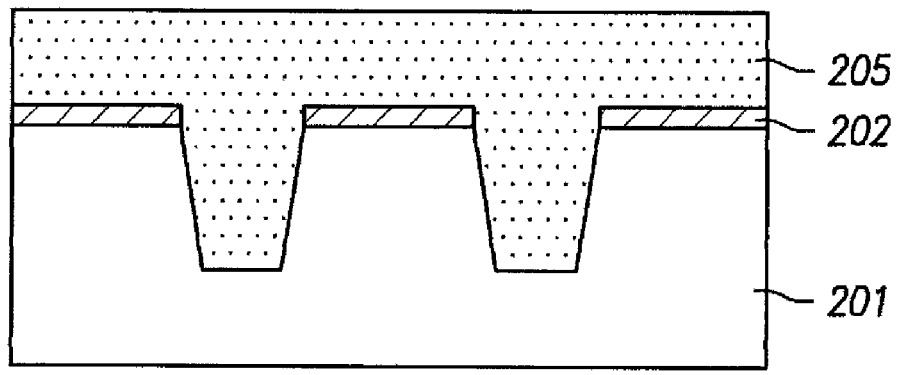

As illustrated in example FIG. 2E, planarization may carried out on trench oxide layer 205. Planarization can be conducted using chemical mechanical polishing (CMP).

Figure 2F:
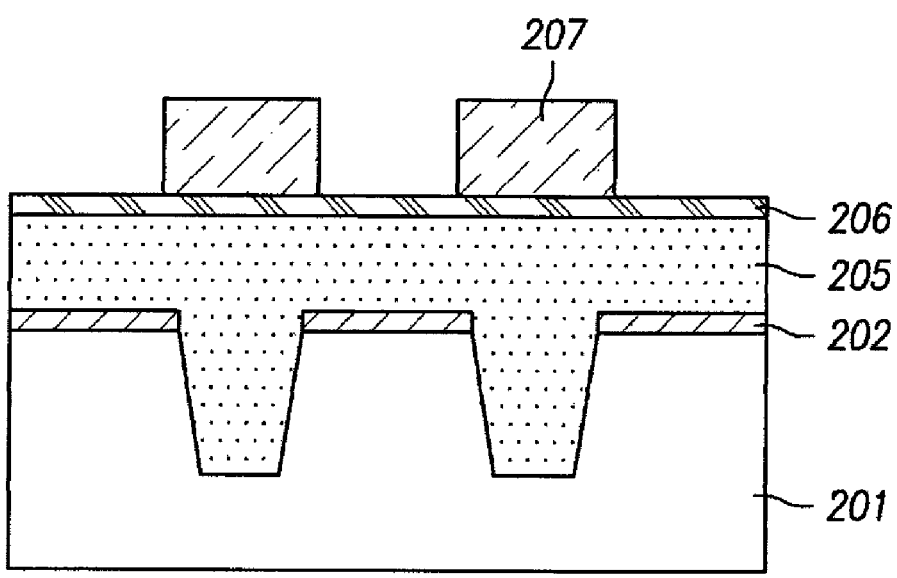

As illustrated in example FIG. 2F, etch-stop layer 206 may be formed on and/or over planarized trench oxide layer 205. A second photoresist layer can also be formed on and/or over planarized trench oxide layer 205. The second photoresist layer can be patterned to expose an active area of substrate 201. Particularly, the second photoresist layer formed on and/or over substrate 201 can be etched using a dry etch such as RIE to form a plurality of second photoresist patterns 207 on and/or over the field area of substrate 201. The step of forming second photoresist patterns 207 can be performed if a hard mask is not used in the trench forming step or the trench oxide layer gap-filling step.

Figure 2G:
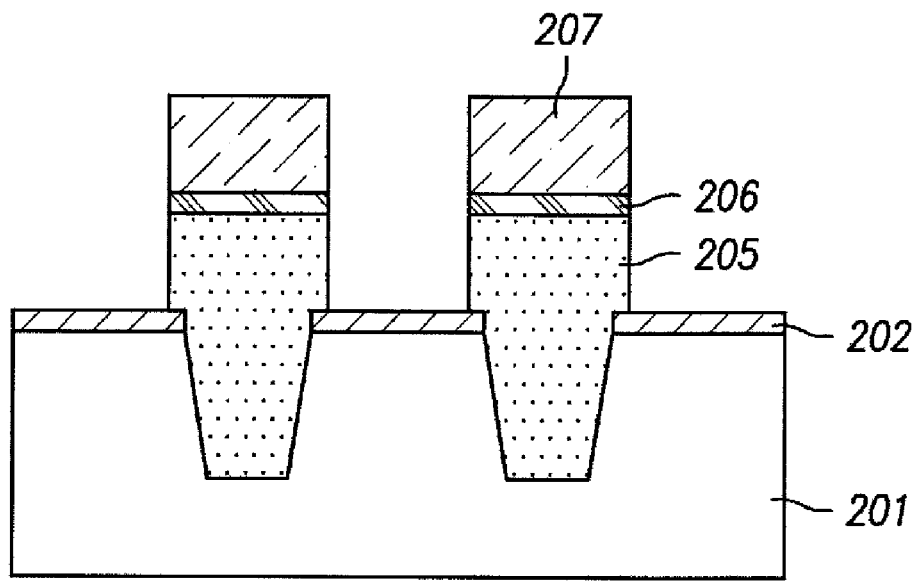

As illustrated in example FIG. 2G, etch-stop layer 206 can be etched using second photoresist pattern 207 as an etch mask. Subsequently, second photoresist pattern 207 and etched-etch stop layer 206 may be used as an etch mask to etch trench oxide layer 205 using a dry etch such as RIE to expose the active area of substrate 201.

In accordance with embodiments, the STI may be formed by forming a sacrifice layer pattern and a photoresist pattern on and/or over an active area of substrate 201 and using the sacrifice layer pattern and the photoresist pattern as etch masks and subsequently performing an etch to expose the active area of substrate 201.

Figure 2H:
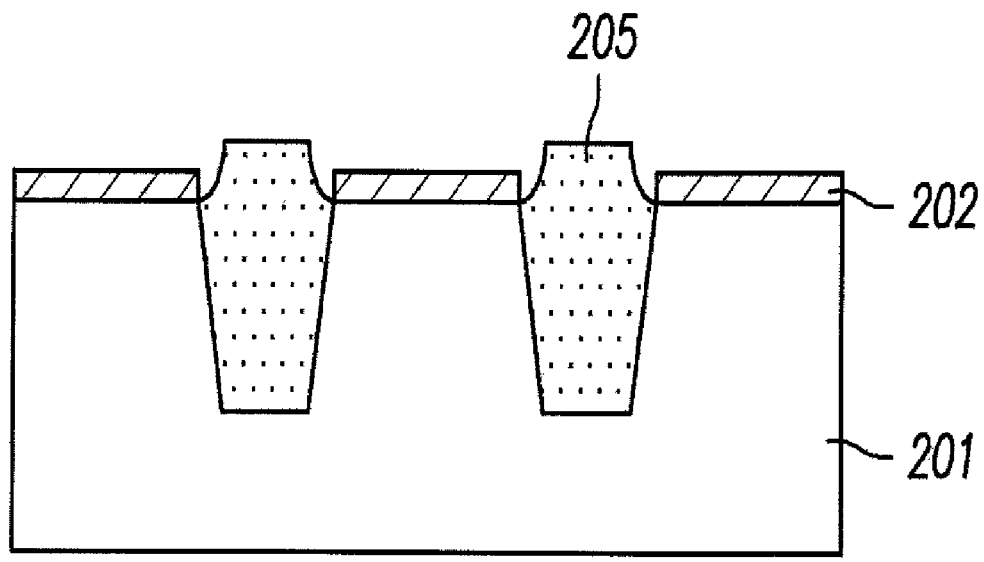

As illustrated in example FIG. 2H, ashing and cleaning may be carried out on remaining portions of second photoresist pattern 207. Accordingly, the STI formed in accordance with embodiments has the capability to implement a normal STI profile without using a hard mask.

Embodiments relate to a method of fabricating a semiconductor device that enhances a margin of gap-fill in filling a trench by reducing an aspect ratio of the trench to thereby prevent the generation of voids. In accordance with embodiments, the trench-forming process may be simplified by not forming a hard mask. Accordingly, an aspect ratio of the trench can be reduced, which in turn reduces overall fabrication cost while increasing productivity.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
forming an oxide layer over a silicon substrate;
forming a first photoresist pattern over the oxide layer;
forming a trench by etching the oxide layer and the silicon substrate using the first photoresist pattern as a mask;
removing the first photoresist pattern;
depositing a trench oxide layer in the trench;
planarizing the trench oxide layer;
forming an etch-stop layer over the trench oxide layer;
forming a second photoresist layer over the etch stop layer;
etching the etch stop layer and the trench oxide layer using the second photoresist pattern as an etch mask; and
removing the second photoresist pattern and the etch stop layer.

2. The method of claim 1, wherein the trench oxide layer comprises tetraethyl orthosilicate.

3. The method of claim 1, wherein the trench is formed using reactive ion etching.

4. The method of claim 1, further comprising:
performing thermal diffusion to harden an inner wall of the trench after forming the trench.

5. The method of claim 1, wherein each of the first and second photoresist patterns is removed by ashing and cleaning.

6. The method of claim 1, wherein the trench oxide layer is deposited using high density plasma chemical vapor deposition.

7. The method of claim 1, wherein planarizing is performed using chemical mechanical polishing.

8. The method of claim 1, wherein the second photoresist pattern is formed over a field area of the silicon substrate.

9. A method comprising:
forming an oxide layer over a silicon substrate;
forming a plurality of first photoresist patterns, wherein each of the plurality of first photoresist patterns are spaced apart by a predetermined gap;
forming a trench within the silicon substrate at each predetermined gap;
conducting thermal diffusion on an inner wall of the trench;
filling the trench with a trench oxide layer having a predetermined thickness;
forming an etch-stop layer over the silicon substrate;
forming a plurality of second photoresist patterns over a field area of the silicon substrate;
etching the etch-stop layer using the second photoresist patterns as a mask;
etching the trench oxide layer using the second photoresist pattern and the etch-stop layer as masks; and
removing the second photoresist pattern and the etch-stop layer.

10. The method of claim 9, wherein the trench is formed using shallow trench isolation.

11. The method of claim 9, wherein the trench is formed using reactive ion etching.

12. The method of claim 9, wherein the trench oxide layer comprises tetraethyl orthosilicate.

13. The method of claim 9, further comprising removing the first photoresist pattern prior to filling the trench with a trench oxide layer.

* * * * *